(12) United States Patent
Gimblet et al.

(10) Patent No.: US 9,788,469 B2
(45) Date of Patent: Oct. 10, 2017

(54) OPTICAL CABLE WITH ELECTROMAGNETIC FIELD SHIELD LAYER

(71) Applicant: Corning Optical Communications LLC, Hickory, NC (US)

(72) Inventors: Michael John Gimblet, Conover, NC (US); James Arthur Register, III, Hickory, NC (US)

(73) Assignee: Corning Optical Communications LLC, Hickory, NC (US)

( * ) Notice: Subject to any disclaimer, the term of this patent is extended or adjusted under 35 U.S.C. 154(b) by 0 days.

(21) Appl. No.: 15/164,376

(22) Filed: May 25, 2016

(65) Prior Publication Data

US 2016/0353617 A1     Dec. 1, 2016

Related U.S. Application Data

(60) Provisional application No. 62/168,130, filed on May 29, 2015.

(51) Int. Cl.
| | |
|---|---|
| *H01B 11/10* | (2006.01) |
| *H01B 11/22* | (2006.01) |
| *G02B 6/44* | (2006.01) |
| *H05K 9/00* | (2006.01) |
| *H01B 13/22* | (2006.01) |

(52) U.S. Cl.
CPC ......... *H05K 9/0086* (2013.01); *G02B 6/4416* (2013.01); *H01B 11/105* (2013.01); *H01B 11/1041* (2013.01); *H01B 11/22* (2013.01); *H01B 13/22* (2013.01); *G02B 6/4432* (2013.01)

(58) Field of Classification Search
CPC .... H05K 9/0086; H01B 11/22; H01B 11/105; H01B 11/1041; G02B 6/4416
See application file for complete search history.

(56) References Cited

U.S. PATENT DOCUMENTS

| 5,103,067 A | 4/1992 | Aldissi |
|---|---|---|
| 5,262,591 A | 11/1993 | Aldissi |

(Continued)

FOREIGN PATENT DOCUMENTS

| CN | 202615903 U | 12/2012 |
|---|---|---|
| CN | 202771059 U | 3/2013 |

OTHER PUBLICATIONS

International Search Report and Written Opinion PCT/US2016/033178 Dated Jun. 29, 2016.

*Primary Examiner* — Omar R Rojas
(74) *Attorney, Agent, or Firm* — William D. Doyle (57) ABSTRACT

A shielded combined optical communication and conductor cable is provided. The cable includes a cable body having an inner surface defining a channel within the cable body. The cable includes an optical transmission element located within the channel and an electrical conducting element located within the channel. The cable includes an electromagnetic shield located within the channel and surrounding at least the electrical conducting element. The electromagnetic shield includes an elongate yarn strand or other strand material that supports a metal material that acts to limit electromagnetic fields from traversing across the electromagnetic shield. The strands may be unbraided and may be helically wrapped or longitudinally positioned within the cable body.

24 Claims, 3 Drawing Sheets

(56) References Cited

U.S. PATENT DOCUMENTS

| | | | | |
|---|---|---|---|---|
| 5,418,878 A * | 5/1995 | Sass | ............ | H01B 11/1891 |
| | | | | 385/101 |
| 5,936,203 A * | 8/1999 | Ryman | ............ | H01Q 13/203 |
| | | | | 174/102 SP |
| 6,563,045 B2 * | 5/2003 | Goett | ............ | H02G 3/0468 |
| | | | | 174/122 R |
| 2013/0287348 A1 | 10/2013 | Register, III et al. | | |
| 2014/0209347 A1 | 7/2014 | Buck et al. | | |

\* cited by examiner

OPTICAL CABLE WITH ELECTROMAGNETIC FIELD SHIELD LAYER

CROSS-REFERENCE TO RELATED APPLICATIONS

This application claims the benefit of priority to U.S. Provisional Application No. 62/168,130, filed on May 29, 2015, and is incorporated herein by reference.

BACKGROUND

The disclosure relates generally to optical communication cables and more particularly to an electromagnetically shielded optical cable that includes at least one electrical conductor element (e.g., a power conductor, copper data conductor, etc.). Optical communication cables have seen increased use in a wide variety of electronics and telecommunications fields. Optical communication cables may contain or surround one or more optical communication fibers. The cable provides structure and protection for the optical fibers within the cable. Many electronic devices within a fiber optic network use electricity to power the device, and in some such arrangements the optical communication cable includes a power conducting element to supply power. In other arrangements, cables include both optical and electrical data communication elements.

SUMMARY

One embodiment of the disclosure relates to a shielded combined optical communication and conductor cable. The cable includes a cable body including a first end, a second end and an inner surface defining a channel within the cable body. The cable includes an optical transmission element located within the channel. The cable includes an electrical conducting element located within the channel. The cable includes an electromagnetic shield located within the channel and surrounding both the optical transmission element and the electrical conducting element. The electromagnetic shield includes a first elongate yarn strand extending at least a portion of the distance between the first end and the second end of the cable body. The first yarn strand supports a metal material that acts to limit electromagnetic fields from traversing the across the electromagnetic shield.

An additional embodiment of the disclosure relates to an optical cable. The cable includes a cable body including a first end, a second end and an inner surface defining a passage within the cable body. The cable includes an elongate optical transmission element located within the passage and extending between the first end and the second end of the cable body. The cable includes an elongate metal wire located within the passage and extending between the first end and the second end of the cable body. The cable includes an electromagnetic shielding layer located within the passage surrounding the elongate metal wire. At least a portion of the electromagnetic shielding layer is located between the inner surface of the cable body and the elongate metal wire. The electromagnetic shield layer includes a helically wrapped strand extending between the first end and the second end of the cable body, and the helically wrapped strand includes a non-metallic core strand supporting a metal material.

An additional embodiment of the disclosure relates to a shielded optical cable. The cable includes a cable body including a first end, a second end and an inner surface defining a channel within the cable body. The cable includes an optical transmission element located within the channel. The cable includes an elongate electrical conductor located within the channel. The cable includes a plurality of elongate strands each including a metal material, wherein the plurality of elongate strands define an electromagnetic shield layer surrounding a portion of the channel in a circumferential direction that includes the optical transmission element and the electrical conductor. The shield layer includes a plurality of gaps defined between the plurality of elongate strands such that between 20% and 80% of a surface area of the radially outward facing surface of the shield layer is occupied by the plurality of elongate strands.

An additional embodiment of the disclosure relates to a method of forming an electromagnetically shielded optical communication cable. The method includes providing an elongate optical transmission element. The method includes providing an elongate metal wire. The method includes forming an electromagnetic shield layer around the elongate metal wire by wrapping an unbraided strand containing a metal material in a helical pattern around the elongate optical transmission element and the elongate metal wire. The metal material acts to limit electromagnetic fields from traversing across the electromagnetic shield layer. The method includes forming a cable body around the electromagnetic shield layer, the elongate optical transmission element and the elongate metal wire.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and operation of the various embodiments.

DETAILED DESCRIPTION

Referring generally to the figures, various embodiments of a combined optical communication and conductor cable are shown. In general, such combined cables include one or more optical transmission element (e.g., an optical fiber based communication component, etc.) and one more electrical conductor element (e.g., copper-based data transmission element, copper-based electrical power based transmission element, etc.). The cable embodiments discussed herein provide an electromagnetic ("EM") shield layer that limits or prevents electromagnetic fields ("EMF"), including radio frequency fields, from traversing either into or out of the cable past the electromagnetic shield layer. In some embodiments in which the electrical conducting element is a conductive data communication element, the shielding layer shields electromagnetic fields from interfering with the electrical conductor data communication elements. In some embodiments in which the electrical conducting element is an electrical power transmission element, the shielding layer shields external components from interference from electromagnetic fields created by electrical conductor power transmission elements located within the cable.

As discussed in more detail below, the cable embodiments discussed herein include an electromagnetic shielding layer formed from one or more strand of metal bearing material arranged in manner that provides sufficient levels of EMF shielding while also providing for improved physical performance, such as higher strength performance, better flexibility, and/or smaller diameter cable design, as compared to conventional EMF shielding materials, such as layers of braided copper wire. In various embodiments, these properties are provided by including a helically wrapped metal containing strand forming a layer surrounding the electrical conductor. In addition, the shielding layer may include longitudinally extending, unwrapped, metal containing strands positioned to the exterior of the electrical conductor. In specific embodiments, the metal containing strands may include a non-metallic core strand, such as yarn, aramid, etc., and an outer layer or coating of metal or metal particles supported from the non-metallic core strand. Applicants believe that by using the arrangement of metal-bearing strands discussed herein (rather than a conventional EMF shield, such as copper braiding), physical performance of the cable can be improved, and the production speed of the cable can be improved by eliminating the slow copper braiding process typically encountered during formation of many conventional EMF shielded cables. In addition, in various embodiments, the cable embodiments discussed herein provide for efficient use of space within the cable jacket by utilizing a metal-bearing tensile strength fiber, such as an aramid fiber, to provide both tensile strength support and EMF shielding functionality.

Figure 1:
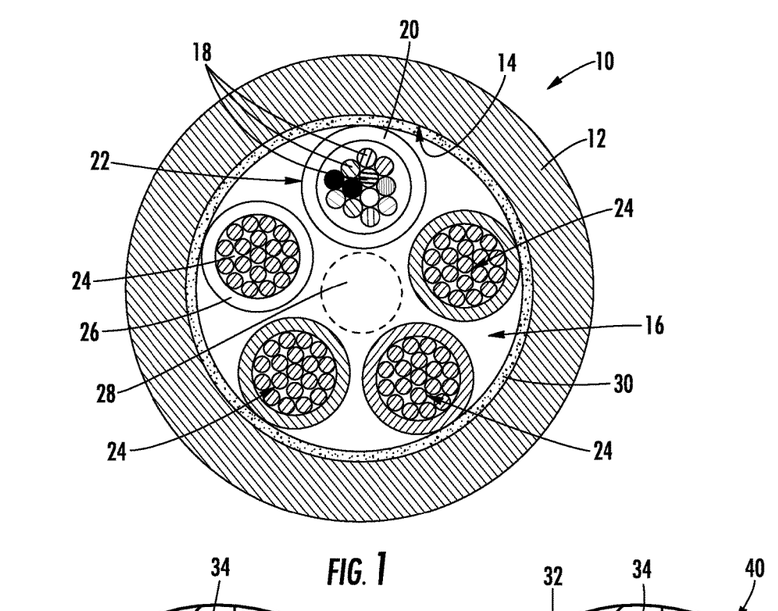
FIG. 1 is a cross-sectional view of a combined optical and conductor cable including a shielding layer according to an exemplary embodiment.

Referring to FIG. 1, an optical communication cable, shown as a combined optical and conductor cable 10, is shown according to an exemplary embodiment. Cable 10 includes a cable body, shown as cable jacket 12, having an inner surface 14 that defines a passage or channel, shown as central bore 16. One or more optical transmission elements, shown as optical fibers 18, are located within bore 16. In the embodiment shown, optical fibers 18 are elongate optical transmission elements located within a tube, shown as buffer tube 20, and buffer tube 20 together with optical fibers 18 defines an optical transmission unit 22. In various embodiments, optical fibers 18 extend between opposing first and second ends of cable 10 such that a signal may be communicated between the opposing ends of the cable. Generally, cable 10 provides structure and protection to optical fibers 18 during and after installation (e.g., protection during handling, protection from elements, protection from vermin, etc.). While FIG. 1 shows a cable 10 that includes a single optical transmission unit 22, cable 10 may include any number optical transmission units 22 (e.g., 2, 4, 6, 8, 12, etc.) as needed for a particular application. In other embodiments, optical transmission unit 22 may be a tight buffered optical fiber, optical fiber ribbon, or another optical fiber containing transmission element.

Cable 10 includes a plurality of electrical conducting elements, shown as elongate metal wires 24, located within bore 16. As shown in FIG. 1, wires 24 include an outer coating or jacket 26. In various embodiments, wires 24 are elongate electrical conducting elements that extend between opposing first and second ends of cable 10, and may be formed from any suitable electrically conducting metal, such as copper. Cable 10 may be useful in various applications in which equipment served by cable 10 uses both high-speed data connectivity provided by optical fibers 18 and electrical power supplied by wires 24. For example, in certain network installations, cable 10 may serve a remote network element (e.g., a wireless router) that uses both a power supply and a high bandwidth communication connection. In such embodiments, cable 10 supplies both power and communication capability within a single cable. As shown, cable 10 includes at least two wires 24. In the specific embodiment shown, cable 10 includes four wires 24. In various embodiments, one or more of the wires 24 may be used for low speed data communication (e.g., for timing circuits) in addition to or instead of supplying power. In some embodiments, cable 10 may be referred to as a hybrid optical and copper cable. As discussed in more detail below, cable 10 can be any hybrid optical and copper cable of the past, present or future including USB type C cables and HDMI cables.

In various embodiments, copper wires 24 may be a wide variety of sizes depending on the power or communication needs served by a particular cable 10. For example, in some embodiments, copper wires 24 have a diameter smaller than or equal to 16 AWG (e.g. the diameter of wires 24 is less than or equal to the diameter of a 16 AWG wire), and in another embodiment, copper wires 24 have a diameter smaller than or equal to 20 AWG. In other embodiments, copper wires 24 are 20 AWG wires, and in yet another embodiment, wires 24 may be 24 or 28 AWG wires.

Cable 10 includes a central area 28 of central bore 16, and optical transmission unit 22 and copper wires 24 are located between inner surface 14 of jacket 12 and central area 28. In various embodiments, cable 10 includes a central strength member located in central area 28. In some embodiments, the central strength member may be a bundle of tensile strength yarn strands, such as aramid yarn strand. Aramid yarn is a yarn formed from aramid (polyamide) fibers. In other embodiments, the strength strands located in central area 28 may be formed from other yarn or fiber materials including other polyamides, liquid crystal polymer (e.g., Vectran), high tenacity polyester, polypropylene, etc. In other embodiments, the central strength member located within central area 28 may be a strength rod, such as a glass-reinforced plastic rod or steel rod.

Cable 10 includes an EM shield, shown as EM shielding layer 30, located within central bore 16. In general and as explained in more detail below, EM shielding layer 30 includes one or more strands of a metal carrying material and is positioned to surround wires 24 in the circumferential direction, as shown in FIG. 1. In this arrangement, EM shielding layer 30 acts to limit or prevent EMF from passing radially through EM shielding layer 30. In embodiments in which wires 24 are power conductors, EM shielding layer 30 acts primarily to limit the ability of EMF generated by the power conductor to exiting cable 10 and to cause interference with electronics or conductors adjacent to cable 10. In embodiments in which wires 24 are data conductors, EM shielding layer 30 acts primarily to limit EMF interference that may otherwise be caused from sources outside of cable 10.

In the embodiment shown in FIG. 1, EM shielding layer 30 is located adjacent to inner surface 14 of cable jacket 12 such that EM shielding layer 30 surrounds both optical fibers 18 and wires 24. Specifically, in the embodiment shown, EM shielding layer 30 is immediately adjacent to inner surface 14 such that inner surface 14 contacts the radially outward facing surface of EM shielding layer 30. In other embodiments, cable 10 may include one or more cable layer, such as binders, water blocking tape, armor layers, etc., between EM shielding layer 30 and inner surface 14 of cable jacket 12.

Figure 2:
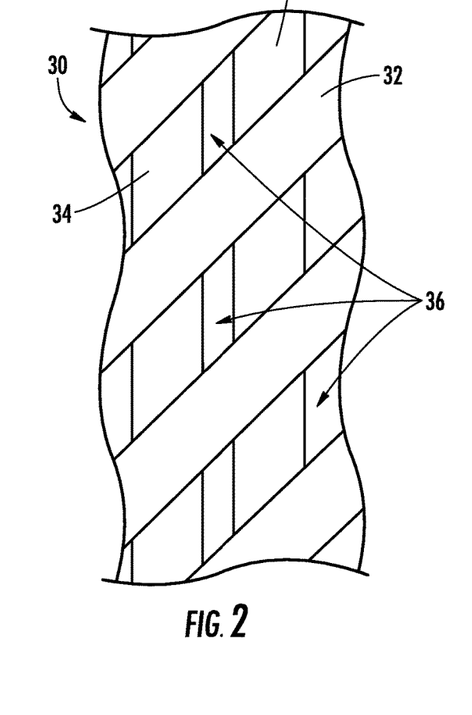
FIG. 2 is detailed view of a section of the shielding layer of the cable of FIG. 1 according to an exemplary embodiment.

Referring to FIG. 2, a detailed view of the radially outward facing surface of a section of EM shielding layer 30 is shown according to an exemplary embodiment. As shown in FIG. 2, EM shielding layer 30 is formed from one or more elongate strand, shown as helical strand 32, and as unwrapped, longitudinal strands 34. In general, strands 32 and 34 are formed from, support or contain a metal material, and the metal material of strands 32 and 34 acts to limit electromagnetic fields from traversing the across the electromagnetic shield. It should be understood that while FIG. 2 shows a subsection of EM shielding layer 30 formed from strands 32 and 34, in various embodiments, strands 32 and 34 extend at least a portion of the distance between opposing ends of cable 10, and, in specific embodiments, strands 32 and 34 extend the entire distance between opposing ends of cable 10. Further, the section of EM shielding layer 30 shown in FIG. 2 repeats as needed in the circumferential direction to surround the internal components of cable 10. In embodiments including unwrapped strands 34, unwrapped strands 34 may reduce coil transfer impedance that may otherwise be present in a shield layer utilizing a wrapped strand alone.

As shown in FIG. 2, EM shield layer 30 includes one or more helical strand 32 that is wrapped around the internal components of cable 10. In some such embodiments, helical strand 32 may take the place of an external binder thread providing both a binding function during cable construction and an EM shielding function in the finished cable. Helical strand 32 may be wrapped either in a right-hand helical twist or in a left-hand helical twist. In various embodiments, EM shielding layer 30 may include both a right-hand helically twisted strand 32 and a left-hand helically twisted stand 32 (e.g., counter-helically wrapped strands 32).

As shown in FIG. 2, EM shield layer 30 also includes one or more unwrapped, longitudinal strands 34. In such embodiments, unwrapped strands 34 extend between opposing ends of cable 10, and when cable 10 is held straight, strands 34 are substantially parallel to the longitudinal axis of cable 10. In such embodiments, strands 34 have a length that is substantially the same as the length of central bore 16 and as the length of jacket 12. While FIG. 2 shows two strands 34, it should be understood, that EM shielding layer 30 may include any number of longitudinal strands 34 as needed to surround wires 24 and/or optical fibers 18.

In the embodiment shown in FIG. 2, longitudinal strands 34 are located underneath helical strand 32 such that longitudinal strands 34 are located between helical strand 32 and the internal components (such as wires 24 and fibers 18) of cable 10. In this arrangement, helical strand 32 acts to provide a radial constraint to longitudinal strands 34. In another embodiment, longitudinal strands 34 are located outside of helical strand 32 such that helical strand 32 is located between longitudinal strands 34 and the internal components (such as wires 24 and fibers 18) of cable 10. In either arrangement, the external surfaces of strands 32 are in contact with the external surfaces of strands 34 such that the strands form an unbraided interconnected mesh or net of metal containing strands that act together as an EM shield.

In various embodiments, strands 32 and 34 are positioned to form a cross-hatched pattern in which a plurality of gaps 36 are formed between adjacent strands within EM shielding layer 30. As shown in FIG. 2, gaps 36 define radial openings that extend all of the way through EM shielding layer 30 such that EM shielding layer 30 is not a contiguous metal shielding layer nor a densely packed layer of separate shielding elements (e.g., such as copper braid segments). In various embodiments, EM shielding layer 30 is formed such that the area of gaps 36 is small enough that the metal bearing strands of EM shielding layer 30 act to sufficiently limit EMF traversal, but is large enough that EM shielding layer 30 allows for a cable that is more flexible and may have a smaller diameter than cables using conventional EM shielding materials, such as copper braid.

In various embodiments, strands 32 and 34 are patterned such that between 20% to 80% of the total surface area of the radially outward facing surface of the zone occupied by EM shielding layer 30 (as shown in FIG. 2) is occupied by strands 32 and 34, and the remainder of the radially outward facing surface area of EM shielding layer 30 is occupied by gaps 36. In specific embodiments, between 30% and 70% of the surface area of the radially outward facing surface of EM shielding layer 30 (as shown in FIG. 2) is occupied by strands 32 and 34, and more specifically between 45% and 65% of the surface area of the radially outward facing surface of EM shielding layer 30 (as shown in FIG. 2) is occupied by strands 32 and 34. It is believed that the percent coverage of strands 32 and 34 within EM shielding layer 30 is substantially less than the coverage typical in copper braid shield layers, which is typically at least 90% or greater.

In various embodiments, strands 32 and 34 may be any suitable metal bearing or containing strand, strip or band material that may be arranged to form EM shielding layer 30 discussed herein. In various embodiments, strands 32 and 34 may be an elongate yarn strand that supports a metal material, and the metal material supported by the yarn strand provides the EM shielding function to EM shielding layer 30. In various embodiments, the yarn strand may be permeated with metal particles. In another embodiment, the yarn strands may include an inner non-metallic yarn strand core surrounded by an outer metal coating. In various embodiments, strands 32 and 34 include aramid yarn strands formed from aramid (polyamide) fibers. In other embodiments, the strands 32 and 34 may be formed from other yarn or fiber materials including other polyamides, liquid crystal polymer (e.g., Vectran), high tenacity polyester, polypropelene, etc. In such embodiments, yarn strands 32 and 34 may support any suitable metal material, including copper, nickel, gold, silver, etc. In a specific embodiment, strands 32 and 34 may be ARACON metalized yarn strands, available from Micro-Coax.

In other embodiments, strands 32 and 34 may be other metal bearing strand materials. In one embodiment, strands 32 and 34 may be formed from bands of metal foil material. In another embodiment, strands 32 and 34 may be formed from a metal bearing tape material.

In various embodiments, strands 32 and 34 may have one or more physical characteristic that provides an improvement over conventional copper braid shielding materials. For example, in embodiments where strands 32 and 34 are metal bearing aramid yarn fibers, strands 32 and 34 have a density that is approximately half or less than half of the density of conventional copper braid. Further, in such embodiments, metalized aramid strands 32 and 34 have greater tensile strength than that of conventional copper braid. For example, in some embodiments, metalized aramid strands 32 and 34 have a tensile strength greater than 100 kilo pounds per square inch (ksi), specifically greater than 200 ksi, and more specifically greater than 300 ksi. In a specific embodiment, the tensile strength of metalized aramid strands 32 and 34 is about 350 ksi (350 ksi plus or minus 10 ksi). This is compared to at least some typical copper braid shielding that has tensile strength of about 36 ksi.

Further, Applicants believe that metalized aramid strands 32 and 34 provide a more flexible cable and better performance under repeated flexing. In addition, aramid yarn has a tendency to flatten which can provide increased fiber coverage, and also decrease the total OD of the cable. In various embodiments, the diameters of metalized aramid strands 32 and 34 is less than copper braid having comparable tensile strength. In various embodiments, aramid strands 32 and 34 have a linear mass density of between 100 denier and 300 denier, and more specifically of about 200 denier (e.g., 200 denier plus or minus 10 denier).

In various embodiments, cable 10 includes connecting elements (e.g., connectors, plugs, etc.) at one or both end of cable 10 that facilitate coupling of cable 10 to the appropriate device. In various embodiments, unwrapped strands 34 may be coupled or bound to the connecting elements at the ends of cable 10 such that unwrapped strands 34 function to support tensile loads experienced by cable 10. Thus, in such embodiments, unwrapped strands 34 combine the tensile strength function and at least a portion of the EM shielding function into a single element, and in some such embodiments, because tensile strength support is provided by unwrapped strands 34, cable 10 does not include a central strength element.

Figure 3:
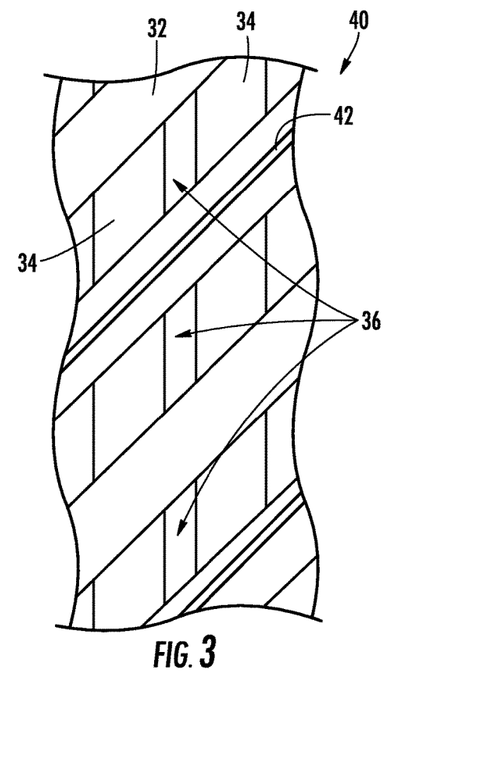
FIG. 3 is detailed view of a section of a shielding layer according to another exemplary embodiment.

Referring to FIG. 3, a detailed view of a section of another EM shield, shown as EM shielding layer 40, is shown according to an exemplary embodiment. EM shielding layer 40 is substantially the same as EM shielding layer 30 except as discussed herein. In the embodiment shown, EM shielding layer 40 includes a metal wire 42. In general, metal wire 42 provides a highly conductive element that may be used to connect of strands 32 and 34 of EM shielding layer 40 to ground. In the embodiment shown, metal wire 42 is a helically wrapped wire having the same helix angle as wrapped strand 32. Metal wire 42 may be formed from copper or any other suitable conductive material.

Figure 4:
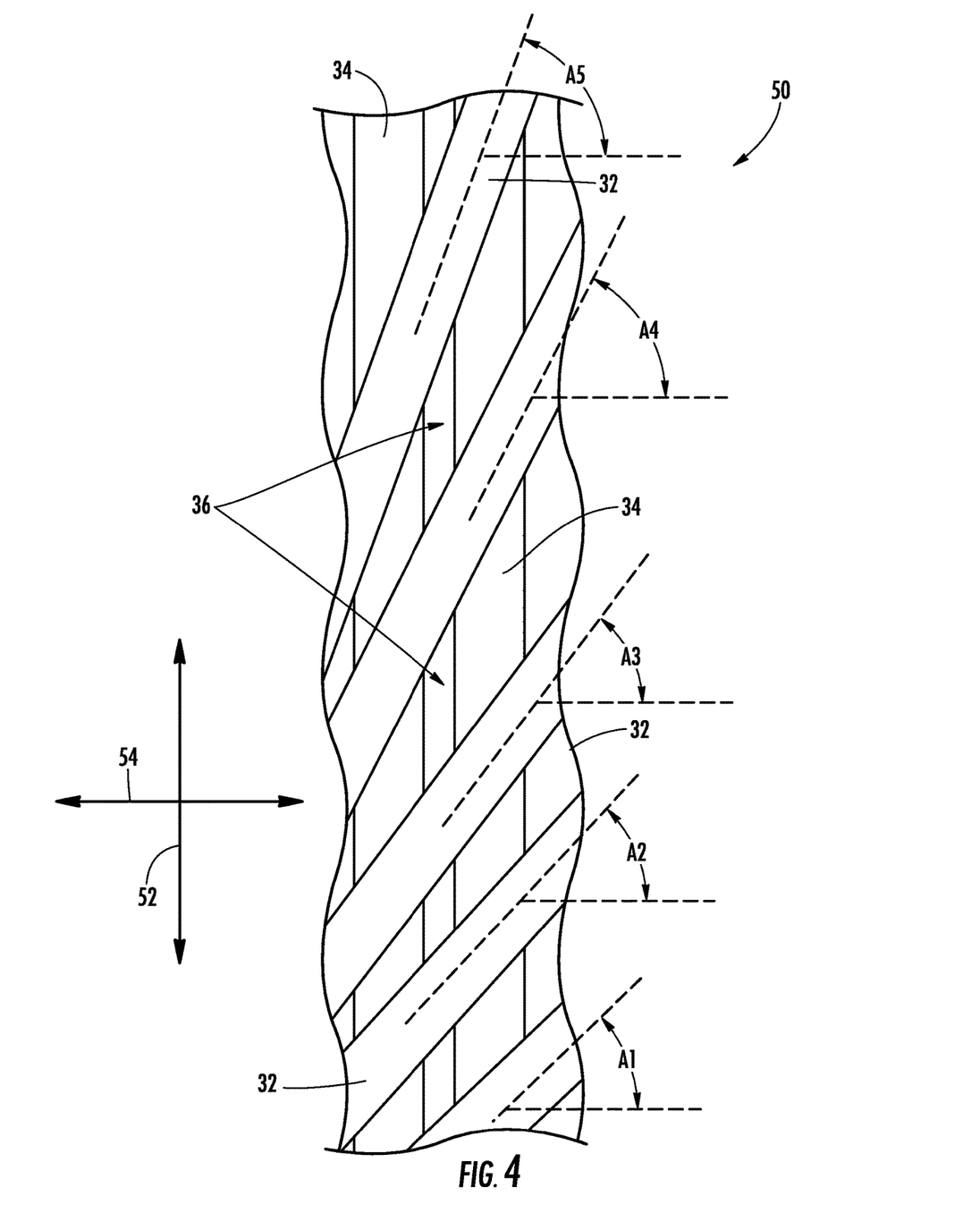
FIG. 4 is detailed view of a section of a shielding layer according to another exemplary embodiment.

Referring to FIG. 4, a detailed view of a section of an EM shielding layer 50 is shown according to an exemplary embodiment. EM shielding layer 50 is substantially the same as EM shielding layer 30 except as discussed herein. EM shielding layer 50 includes wrapped strand 32 that has a helix angle or pitch angle that varies at different positions in the direction of longitudinal axis 52 of cable 10. In FIG. 4, the longitudinal axis 52 and the radial axis 54 of cable 10 are shown schematically. In the specific embodiment shown, each adjacent twist of wrapped strand 32 defines a helix angle, shown angles A1-A5, relative to the radial axis 54. As shown in FIG. 4, angles A1-A5 increase along the length of longitudinal axis 52. In various embodiments, once the helix angle of wrapped strand 32 reaches a maximum angle, the helix angles decrease along the length of longitudinal axis 52 such that helix angle both increases and decreases along the length of cable 10. In another embodiment, the relative size of the helix angles of wrapped strand 32 is independent of longitudinal position such that the helix angle is random along the length of cable 10. In various embodiments, frequency dependent transfer impedance of the shielding material can be mitigated by varying the helix angle of wrapped strand 32.

Figure 5:
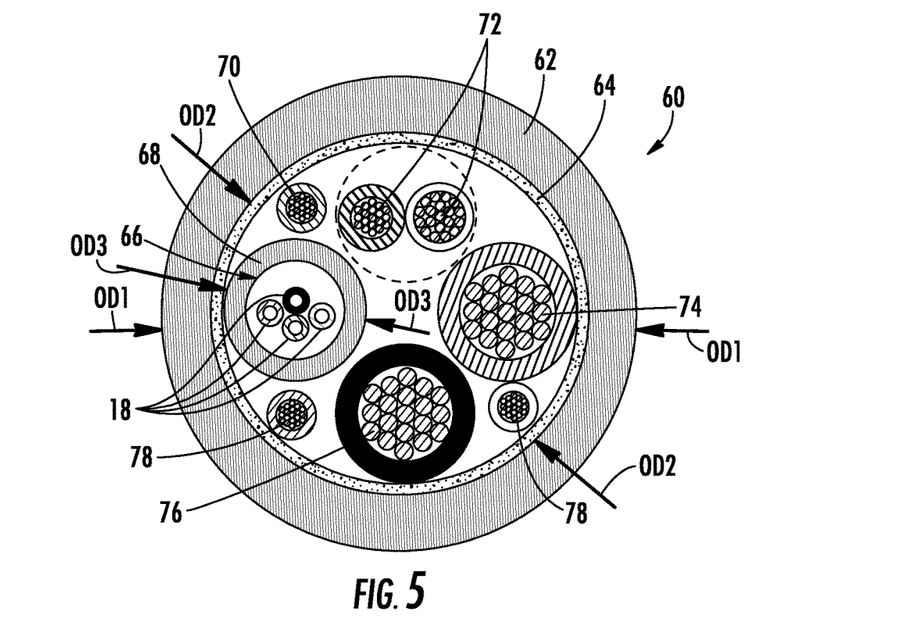
FIG. 5 is a cross-sectional view of a combined optical and conductor cable including a shielding layer according to another exemplary embodiment.
Figure 6:
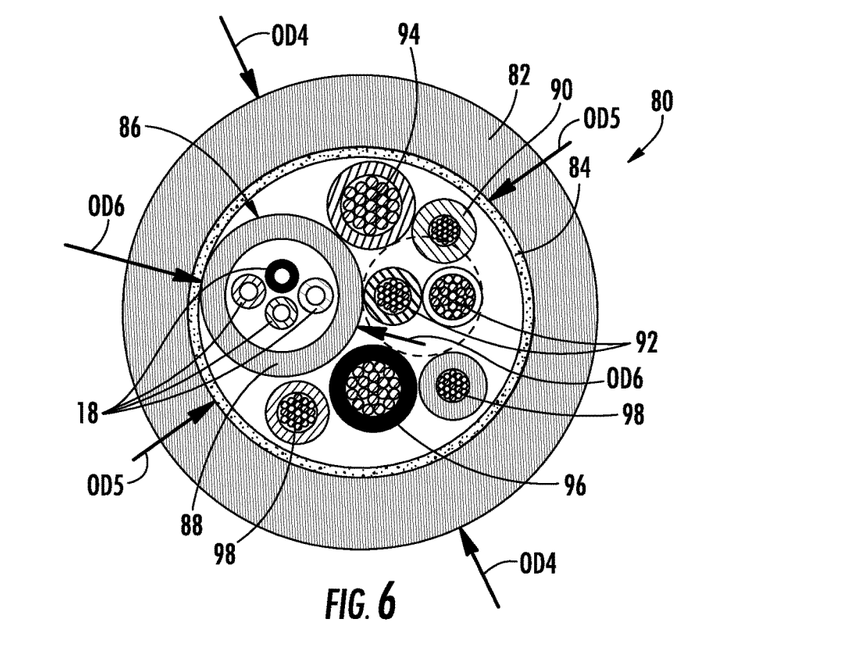
FIG. 6 is a cross-sectional view of a combined optical and conductor cable including a shielding layer according to another exemplary embodiment

Referring to FIG. 5 and FIG. 6, EM shielding layer 30 may be used in a wide variety of cables that combine both optical transmission elements and conductor elements. Referring to FIG. 5, an optical cable, shown as combined optical and conductor cable 60, is shown according to an exemplary embodiment. Cable 60 is substantially the same as cable 10 except as discussed herein. Like cable 10, cable 60 includes a cable jacket 62 and an EM shielding layer 64. Shielding layer 64 may be formed as shielding layers 30, 40 or 50 discussed above but is sized to surround the specific cable components shown in FIG. 5.

In various embodiments, cable 60 is a large AWG USB type C cable. In such embodiments, cable 60 includes an optical fiber unit 66 that includes four optical fibers 18 located within a buffer tube 68. Cable 60 includes a 32 AWG wire 70 that may function as a configuration channel. Cable 60 includes a twisted pair of 28 AWG wires 72 that provides USB 2.0 backward compatibility. Cable 60 includes a power conductor, shown as 20 AWG VBus power wire 74, and a ground conductor, shown as 20 AWG VBus ground wire 76. Cable 60 may also include two 32 AWG wires 78. In in this embodiment, EM shielding layer 64 is configured to limit EM interference on data communication conductive elements, such as wire 70 and wire 72, and is also configured to limit EMF interference generated by power wire 74 that may otherwise be experienced by electronic devices in proximity to cable 60.

In various embodiments, cable 60 includes an outer jacket diameter, shown as OD1. In various embodiments, OD1 is between 4 mm and 5 mm, specifically is between 4.4 mm and 4.6 mm, and more specifically is 4.58 mm. In various embodiments, EM shielding layer 64 has an outer diameter, shown as OD2. In various embodiments, OD2 is between 3 mm and 4 mm, specifically is between 3.4 mm and 3.6 mm, and more specifically is 3.58 mm. In such embodiments, jacket 62 has a thickness that is one half the difference between OD1 and OD2. In various embodiments, buffer tube 68 has an outer diameter, shown as OD3. In various embodiments, OD3 is between 1 mm and 2 mm, specifically is between 1.3 mm and 1.5 mm, and more specifically is 1.4 mm. In various embodiments, the relatively thin and flexible nature of the strands of shield layer 64 facilitate formation of a compact cable having these relatively small diameters while yet providing adequate EM shielding for the components of cable 60.

Referring to FIG. 6, an optical cable, shown as combined optical and conductor cable 80, is shown according to an exemplary embodiment. Cable 80 is substantially the same as cable 10 except as discussed herein. Like cable 10, cable 80 includes a cable jacket 82 and an EM shielding layer 84. Shielding layer 84 may be formed as shielding layers 30, 40 or 50 discussed above but is sized to surround the specific cable components shown in FIG. 6.

In various embodiments, cable 80 is a small, short distance, AWG USB type C cable. In such embodiments, cable 80 includes an optical fiber unit 86 that includes four optical fibers 18 located within a buffer tube 88. Cable 80 includes a 34 AWG wire 90 that may function as a configuration channel. Cable 80 includes a twisted pair of 34 AWG wires 92 that provides USB 2.0 backward compatibility. Cable 80 includes a power conductor, shown as 28 AWG VBus power wire 94, and a ground conductor, shown as 28 AWG VBus ground wire 96. Cable 80 may also include two 34 AWG wires 98. In in this embodiment, EM shielding layer 84 is configured to limit EM interference on data communication conductive elements, such as wire 90 and wire 92, and is also configured to limit EMF interference generated by power wire 94 that may otherwise be experienced by electronic devices in proximity to cable 80.

In various embodiments, cable 80 includes an outer jacket diameter, shown as OD4. In various embodiments, OD4 is between 3 mm and 4 mm, specifically is between 3.4 mm and 3.6 mm, and more specifically is 3.53 mm. In various embodiments, EM shielding layer 84 has an outer diameter, shown as OD5. In various embodiments, OD5 is between 2mm and 3 mm, specifically is between 2.4 mm and 2.6 mm, and more specifically is 2.53 mm. In such embodiments, jacket 82 has a thickness that is one half the difference between OD4 and OD5. In various embodiments, buffer tube 88 has an outer diameter, shown as OD6. In various embodiments, OD6 is between 0.8 mm and 1.8 mm, specifically is between 1.1 mm and 1.2 mm, and more specifically is 1.2 mm. In various embodiments, the relatively thin and flexible nature of the strands of shield layer 84 facilitate formation of a compact cable having these relatively small diameters while yet providing adequate EM shielding for the components of cable 80.

In various embodiments, a method of forming a shielded optical cable, such as cables 10, 60 and 80, is provided. In various embodiments, the method includes providing an elongate optical transmission element, such as optical fibers 18 or optical fiber units 22, 66 and 86. In various embodiments, the method includes providing an elongate metal wire, such as wires 24 or the wires of cables 60 and 80. In various embodiments, the optical transmission elements and metal wire may be arranged together to from a cable core.

The method includes forming an electromagnetic shield layer around the elongate metal wire by wrapping an unbraided metal containing strand, such as strand 32, around the elongate optical transmission element and/or the elongate metal wire in the circumferential direction. In some such embodiments, the metal containing strand is a yarn strand includes a non-metallic core strand supporting a metal material, and the metal material acts to limit electromagnetic fields from traversing across the electromagnetic shield layer. In other embodiments, the metal containing strand is band of foil material.

In various embodiments, following the formation of the electromagnetic shield, the method includes forming a cable body around the electromagnetic shield layer, the elongate optical transmission element and the elongate metal wire. In various embodiments, the step of forming the electromagnetic shield by wrapping the metallic strand may occur in line with the jacket formation step. Thus, the method disclosed herein is believed to allow for formation of shielded optical cables at higher production speeds and longer production lengths as compared to cable formation processes in which a metal wire is braided around the cable core to form a shield layer.

In various embodiments, the step of forming the electromagnetic shield layer includes wrapping the yarn strand in a helical pattern and varying the helix angle of the helical pattern as the yarn strand is wrapped around different portions of the elongate metal wire. In various embodiments, the step of forming the electromagnetic shield layer includes providing an unwrapped yarn strand, such as strands 34, to the exterior of the elongate metal wire. In certain embodiments, the unwrapped strand is a yarn strand that includes a non-metallic core strand supporting a metal material, and the metal material that acts to limit electromagnetic fields from traversing across the electromagnetic shield layer. In various embodiments, both the helically wrapped yarn strand and the unwrapped yarn strand are located exterior to both the elongate optical transmission element and the elongate wire. In various embodiments, the helically wrapped yarn strand is wrapped around and to the exterior of the unwrapped yarn strand. In various embodiments, the non-metallic core strand of both the helically wrapped yarn strand and the unwrapped yarn strand are aramid yarn strands, and the metal material of both the helically wrapped yarn strand and the unwrapped yarn strand includes at least one of copper, gold, silver, and nickel.

While the specific cable embodiments discussed herein and shown in the figures relate primarily to cables that have a substantially circular cross-sectional shape defining substantially cylindrical internal lumens, in other embodiments, the cables discussed herein may have any number of cross-section shapes. For example, in various embodiments, the cable jackets discussed herein may have an elliptical, square, rectangular, triangular or other polygonal cross-sectional shape. In such embodiments, the passage or lumen of the cable may be the same shape or different shape than the shape of the cable jackets discussed herein. In some embodiments, the cable jackets discussed herein may define more than one channel or passage. In such embodiments, the multiple channels may be of the same size and shape as each other or may each have different sizes or shapes.

In various embodiments, the cable jackets discussed herein may be a variety of materials used in cable manufacturing such as medium density polyethylene, polyvinyl chloride (PVC), polyvinylidene difluoride (PVDF), nylon, polyester or polycarbonate and their copolymers. In addition, the material of the cable jackets discussed herein may include small quantities of other materials or fillers that provide different properties to the material of the cable jacket. For example, the material of the cable jacket may include materials that provide for coloring, UV/light blocking (e.g., carbon black), burn resistance, etc.

In various embodiments, buffer tubes of optical fiber units may be formed from an extruded thermoplastic material extruded to surround fibers 18. In one embodiment, buffer tubes are formed from a polypropylene material. In another embodiment, buffer tubes are formed from a polycarbonate material. In various embodiments, buffer tubes are formed from one or more polymer material including polybutylene terephthalate (PBT), polyamide (PA), polyoxymethylene (POM), polyvinylchloride (PVC), flame retardant PCV, poly (ethene-co-tetrafluoroethene) (ETFE), combination of the polymer materials discussed herein, etc. In various embodiments, the material of buffer tubes may include various fillers or additives including UV blocking materials and burn resistant materials.

The optical fibers discussed herein may be flexible, transparent optical fibers made of glass or plastic. The fibers may function as a waveguide to transmit light between the two ends of the optical fiber. Optical fibers may include a transparent core surrounded by a transparent cladding material with a lower index of refraction. Light may be kept in the core by total internal reflection. Glass optical fibers may comprise silica, but some other materials such as fluorozirconate, fluoroaluminate, and chalcogenide glasses, as well as crystalline materials, such as sapphire, may be used. The light may be guided down the core of the optical fibers by an optical cladding with a lower refractive index that traps light in the core through total internal reflection. The cladding may be coated by a buffer and/or another coating(s) that protects it from moisture and/or physical damage. These coatings may be UV-cured urethane acrylate composite materials applied to the outside of the optical fiber during the drawing process. The coatings may protect the strands of glass fiber.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A shielded combined optical communication and conductor cable comprising:
    a cable body including a first end, a second end, and an inner surface defining a channel within the cable body;
    an optical transmission element located within the channel;
    an electrical conducting element located within the channel; and
    an electromagnetic shield located within the channel and surrounding both the optical transmission element and the electrical conducting element, wherein the electromagnetic shield comprises a first elongate yarn strand extending at least a portion of the distance between the first end and the second end of the cable body, wherein the first yarn strand supports a metal material that acts to limit electromagnetic fields from traversing across the electromagnetic shield;
    wherein the first elongate yarn strand is helically wrapped around the optical transmission element and the electrical conducting element;
    wherein the electromagnetic shield includes a second elongate yarn strand and a third elongate yarn strand, wherein the second and third elongate yarn strands support a metal material that acts to limit electromagnetic fields from traversing the across the electromagnetic shield, wherein the second and third elongate yarn strands are unwrapped strands that extend longitudinally between the first and second ends of the cable body, wherein the second and third elongate yarn strands have a length that is substantially the same as a length of the cable body such that the second and third elongate yarn strands are tensile strength members that bear a portion of a tensile load applied to the cable.

2. The shielded combined optical communication and conductor cable of claim 1, wherein the helix angle of the helically wrapped first elongate yarn strand varies along a longitudinal axis of the cable.

3. The shielded combined optical communication and conductor cable of claim 1, wherein tensile strengths of the second yarn strand and third yarn strand are greater than 100 kilo pounds per square inch (ksi).

4. The shielded combined optical communication and conductor cable of claim 3, wherein the first elongate yarn strand is wrapped around the second and the third elongate yarn strands such that the second and the third elongate yarn strands are located between the first elongate yarn strand and the electrical conducting element.

5. The shielded combined optical communication and conductor cable of claim 4, wherein the electromagnetic shield includes a metal wire.

6. The shielded combined optical communication and conductor cable of claim 1, wherein the electromagnetic shield includes a plurality of additional yarn strands, each additional yarn strand supporting a metal material, wherein the electromagnetic shield includes a plurality of gaps defined between adjacent segments of the first elongate yarn strands and of the additional yarn strands such that between 20% and 80% of a surface area of the radially outward facing surface of the electromagnetic shield is occupied by the first elongate yarn strand and the plurality of additional yarn strands.

7. The shielded combined optical communication and conductor cable of claim 1, wherein the first yarn strand is an aramid yarn strand, and the metal material is at least one of copper, gold, silver, and nickel.

8. The shielded combined optical communication and conductor cable of claim 7, wherein a tensile strength of the first yarn strand is greater than 100 kilo pounds per square inch (ksi).

9. An optical cable comprising;
    a cable body including a first end, a second end and an inner surface defining a passage within the cable body;
    an elongate optical transmission element located within the passage and extending between the first end and the second end of the cable body;
    an elongate metal wire located within the passage and extending between the first end and the second end of the cable body; and
    an electromagnetic shielding layer located within the passage surrounding the elongate metal wire, wherein at least a portion of the electromagnetic shielding layer is located between the inner surface of the cable body and the elongate metal wire, wherein the electromagnetic shield layer comprises a helically wrapped strand extending between the first end and the second end of the cable body;
    wherein the helically wrapped strand includes a non-metallic core strand supporting a metal material;
    wherein the helix angle of the helically wrapped strand varies along a longitudinal axis of the cable.

10. The optical cable of claim 9, wherein the helically wrapped strand is wrapped around both the elongate optical transmission element and the elongate metal wire such that the helically wrapped strand provides a radial electromagnetic shield surrounding both the elongate optical transmission element and the elongate metal wire.

11. The optical cable of claim 10, wherein the electromagnetic shielding layer further comprises a plurality of additional elongate strands extending longitudinally, unwrapped between the first and second ends of the cable body, where the additional, elongate strands each, include a non-metallic core strand supporting a metal material, wherein the length of each of the additional elongate strands is substantially equal to the longitudinal length of the cable body between the first and second ends such that the additional elongate strands are tensile strength members that bear a portion of a tensile load applied to the cable and that each have a tensile strength greater than 100 kilo pounds per square inch (ksi).

12. The optical cable of claim 11, wherein an external surface of the helically wrapped strand contacts an external surface of each of the additional elongate strands to form the electromagnetic shielding layer.

13. The optical cable of claim 12, wherein the non-metallic core strand of each of the helically wrapped strand and of the additional elongate strands is an aramid fiber material and the metal material of each of the helically wrapped strand and of the additional elongate strands includes at least one of copper, gold, silver, and nickel.

14. A shielded optical cable comprising:
   a cable body including a first end, a second end and an inner surface defining a channel within the cable body;
   an optical transmission element located within the channel;
   an elongate electrical conductor located within the channel; and
   a plurality of elongate strands each including a metal material, wherein the plurality of elongate strands define an electromagnetic shield layer surrounding a portion of the channel in a circumferential direction that includes the optical transmission element and the electrical conductor;
   wherein the shield layer includes a plurality of gaps defined between the plurality of elongate strands such that between 20% and 80% of a surface area of the radially outward facing surface of the shield layer is occupied by the plurality of elongate strands;
   wherein at least one of the plurality elongate strands is helically wrapped around the optical transmission element and the electrical conductor;
   wherein the helix angle of the helically wrapped elongate strand varies along the longitudinal length of the cable.

15. The shielded optical cable of claim 14, wherein at least one of the plurality of elongate strands extends longitudinally, unwrapped between the first and second ends of the cable body such that the length of the unwrapped elongate strand is substantially equal to the longitudinal length of the cable body between the first and second ends such that the at least one unwrapped elongate strand is a tensile strength member that bears a portion of a tensile load applied to the cable and that has a tensile strength greater than 100 kilo pounds per square inch (ksi).

16. The shielded optical cable of claim 15, wherein an external surface of the helically wrapped elongate strand contacts an external surface of the unwrapped elongate strand.

17. The shielded optical cable of claim 14, wherein the elongate strand is one of a band of metal foil and a non-metallic yarn strand supporting the metal material.

18. The shielded optical cable of claim 17, wherein the elongate strand is an aramid yarn strand supporting the metal material.

19. A method of forming an electromagnetically shielded optical communication cable comprising:
   providing an elongate optical transmission element;
   providing an elongate metal wire;
   forming an electromagnetic shield layer around the elongate metal wire by wrapping an unbraided strand containing a metal material in a helical pattern around the elongate optical transmission element and the elongate metal wire, wherein the step of forming the electromagnetic shield layer includes varying the helix angle of the helical pattern as the unbraided strand is wrapped around different portions of the elongate metal wire, wherein the metal material acts to limit electromagnetic fields from traversing across the electromagnetic shield layer; and
   forming a cable body around the electromagnetic shield layer, the elongate optical transmission element and the elongate metal wire.

20. The method of claim 19, wherein the unbraided strand containing the metal material is a yarn strand including a non-metallic core supporting the metal material.

21. The method of claim 20, wherein the step of forming the electromagnetic shield layer includes providing an unwrapped yarn strand to an exterior of the elongate metal wire, wherein the unwrapped yarn strand includes a non-metallic core strand supporting a metal material, and the metal material that acts to limit electromagnetic fields from traversing across the electromagnetic shield layer, wherein the unwrapped yarn strand is a tensile strength member that bears a portion of a tensile load applied to the cable and that has a tensile strength greater than 100 kilo pounds per square inch (ksi).

22. The method of, claim 21, wherein both the helically wrapped yarn strand and the unwrapped yarn strand are located exterior to both the elongate optical transmission element and the elongate wire.

23. The method of claim 22, wherein the helically wrapped yarn strand is wrapped around and to the exterior of the unwrapped yarn strand.

24. The method of claim 22, wherein the non-metallic core strand of both the helically wrapped yarn strand and the unwrapped yarn strand are aramid yarn strands and the metal material of both the helically wrapped yarn strand and the unwrapped yarn strand includes at least one of copper, gold, silver, and nickel.

* * * * *